United States Patent [19]
Houston

[11] Patent Number: 5,193,076
[45] Date of Patent: Mar. 9, 1993

[54] CONTROL OF SENSE AMPLIFIER LATCH TIMING

[75] Inventor: Theodore W. Houston, Richardson, Tex.

[73] Assignee: Texas Instruments Incorporated, Dallas, Tex.

[21] Appl. No.: 647,615

[22] Filed: Jan. 28, 1991

Related U.S. Application Data

[63] Continuation of Ser. No. 288,399, Dec. 22, 1988, abandoned.

[51] Int. Cl.[5] .................................. G11C 8/00
[52] U.S. Cl. .................................. 365/233.5; 365/203; 365/230.03
[58] Field of Search ............ 365/233, 230.03, 233.5, 365/189.05, 189.11, 190, 203, 208

[56] References Cited

U.S. PATENT DOCUMENTS

| | | | |
|---|---|---|---|
| 4,592,028 | 5/1986 | Konishi | 365/233.5 |
| 4,616,342 | 10/1986 | Miyamoto | 365/190 X |
| 4,661,931 | 4/1987 | Flannagan et al. | 365/23.5 |
| 4,701,889 | 10/1987 | Ando | 365/203 |
| 4,730,279 | 3/1988 | Ohtani | 365/233.5 |
| 4,744,063 | 5/1988 | Ohtani et al. | 365/233 X |
| 4,751,680 | 6/1988 | Wang et al. | 365/203 X |
| 4,800,304 | 1/1989 | Tekeuchi | 365/233.5 |
| 4,813,022 | 3/1989 | Matsui et al. | 365/203 X |
| 4,843,596 | 6/1989 | Miyataki et al. | 365/233.5 X |
| 4,985,865 | 1/1991 | Houston . | |

FOREIGN PATENT DOCUMENTS 59-63091  4/1984  Japan .................................. 365/233.5

OTHER PUBLICATIONS

Sood, Lal C., et al., "A Fast 8Kx8 CMOS SRAM with Internal Power Down Design Techniques", IEEE Jnl of Solid State Circuits, vol. SC-20, No. 5, pp. 941-950, Oct. 1985.

Schuster, S., et al. "A 20ns 64k NMOS RAM", ISSCC Digest of Technical Papers, pp. 226-227; Feb., 1984.

Schuster, S., et al., "An 11ns 64k (4kx]6) NMOS RAM," 1985 International Symposium of VLSI Technology, Systems and Applications, pp. 24-28, May 1085.

Flannagan, S. T., et al., "Two 13-ns 64K CMOS SRAMs with Very Low Active Power and Improved Asynchronous Circuit Techniques", IEEE Jnl of Solid State Circuits, vol. SC-21, No. 5, pp. 692-703, Oct. 1986.

Primary Examiner—Joseph A. Popek
Attorney, Agent, or Firm—Stanton Braden; Richard Donaldson; William Hiller

[57] ABSTRACT

A static random access memory timing scheme is disclosed in which the latching of a sense amplifier is derived from substantially the same point in the a timing chain as is the precharge/equalization signal, which is derived from the row address transition detection signal (as is the word line gating signal). Fan-in is minimized so as to allow good immunity to gamma dot and parameter variations.

6 Claims, 6 Drawing Sheets

CONTROL OF SENSE AMPLIFIER LATCH TIMING

FIELD OF THE INVENTION

This invention is in the field of semiconductor memories and was made with the support of the U.S. Government under contract number DNA 001-86-0090 awarded by the Defense Nuclear Agency.

This is a continuation of application Ser. No. 07/288,399, filed Dec. 22, 1988, now abandoned.

BACKGROUND OF THE INVENTION

Control of the timing is critical for a latching sense amplifier (amp is a shorten version of the word amplifier and shall be used throughout) in a memory such as a SRAM (static random access memory). For instance, if the sense am is latched too soon, a wrong output can result. If it is delayed more than necessary, the extra delay is added to the access time of the memory. In a dynamic random access memory (DRAM) a clock is used to control the sense amp timing. However, in asynchronous SRAMs, the problem is more difficult. Schuster et al. use a signal created by any word line changing to a logic high voltage to control sense amp timing. See Schuster, S., et al., "A 20 ns 64k NMOS RAM", ISSCC Digest of Technical Papers, p. 226-227; Feb., 1984. Also see Schuster, S., et al., "An 11 ns 64k (4k×16) NMOS RAM," 1985 International Symposium of VLSI Technology, Systems and Applications, p. 24-28; May 1985.

FIG. 1 is a schematic drawing of circuitry representing the Schuster timing approach. Word line drivers comprising inverters 2 are each connected to a respective word line WL. Each word line is connected to the gates of pass transistors (not shown) which are connected between bit lines (BL and BL_) and memory cells 4. Precharge circuitry 6 is connected to bit lines BL and BL_ which are in turn connected to pass transistors 8. Pass transistors 8, when turned on, connect memory cells 4 to sense amp 10. N-channel pull down transistors 12 each have a gate connected to a respective word line WL. The drains of transistors 12 are connected by line L to the drain of p-channel pull up transistor 14 which has its source connected to a predetermined voltage Vdd. The drains of transistors 12 and 14 are also connected by line L to the input of inverter 16 which is connected to sense amp 10.

In operation, the circuit of FIG. 1 receives a logic low signal at a selected inverter 2 of a word line driver. This signal is eventually received by the gate of a selected transistor 12 which pulls line L down in voltage. This low voltage is received by the input of inverter 16 which in turn latches sense amp 10 such that the memory state of a selected cell can be determined.

The problem with Schuster's scheme is that the sense amp timing control is based on a dynamic NOR with a relatively large number of inputs. Thus, if Schuster's scheme were employed in a device exposed to, for instance, gamma dot radiation, there would likely be disastorous consequences. Gamma dot radiation is high short pulsed transient dose radiation which creates electron-hole pairs which produces photo current in a memory. Therefore, exposure to gamma dot radiation of a memory employing Schuster's scheme would produce photo current in pull down transistors 12 and cause sense amp 10 to possibly latch at the wrong time. Neither dynamic gates nor a large gate fan-in are good for gamma dot situations. Also, gates with large fan-in are more sensitive to parameter variation.

A need exists for control of sense amplifier latch timing which is not substantially susceptible to transient dose radiation.

OBJECTS OF THE INVENTION

It is an object of the invention to provide a new and improved sense amplifier latch timing scheme for a memory.

It is another object of the invention to provide a new and improved sense amplifier latch timing scheme which is substantially immune to gamma dot and parameter variation.

SUMMARY OF THE INVENTION

The foregoing objects of the invention are accomplished by a scheme wherein the signal controlling the latching of a sense amplifier is derived from substantially the same point in a timing chain as is a bit line precharge/equalization signal. The bit line precharge/equalization signal and a word line gating signal are derived from the an address transition detection signal. No gates in the scheme require a large fan-in. Thus, immunity is good against gamma dot and parameter variation.

BRIEF DESCRIPTION OF THE DRAWINGS

FIG. 2b illustrates timing diagrams relevant to the circuit of FIG. 2a.

DETAILED DESCRIPTION OF THE INVENTION

The invention controls the sense amp latch with the same timing chain as used to control the timing of the word lines and the bit line precharge in a memory.

Figure 1:
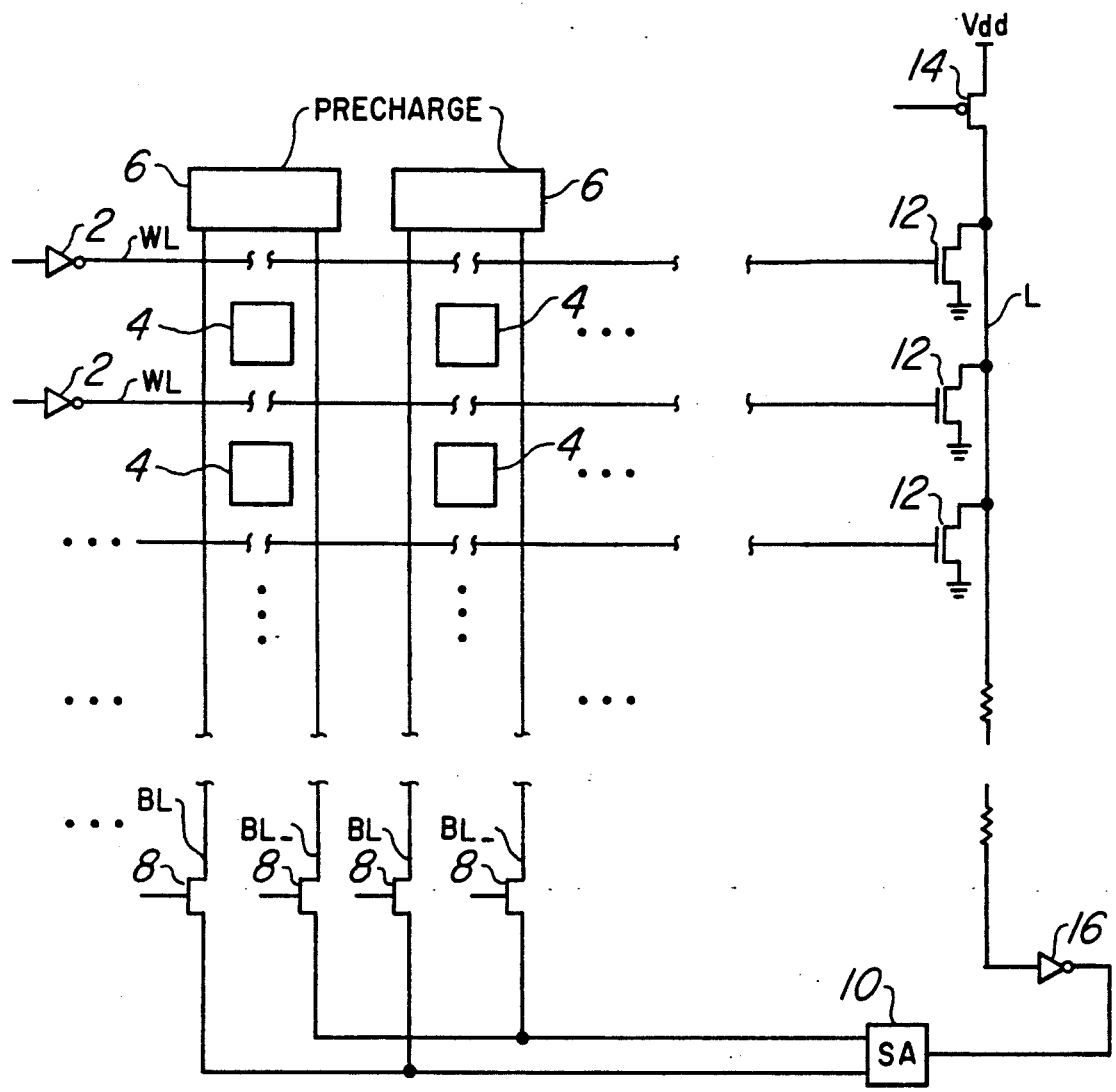
FIG. 1 is a schematic drawing of a prior art sense amp latch circuit.
Figure 2A:
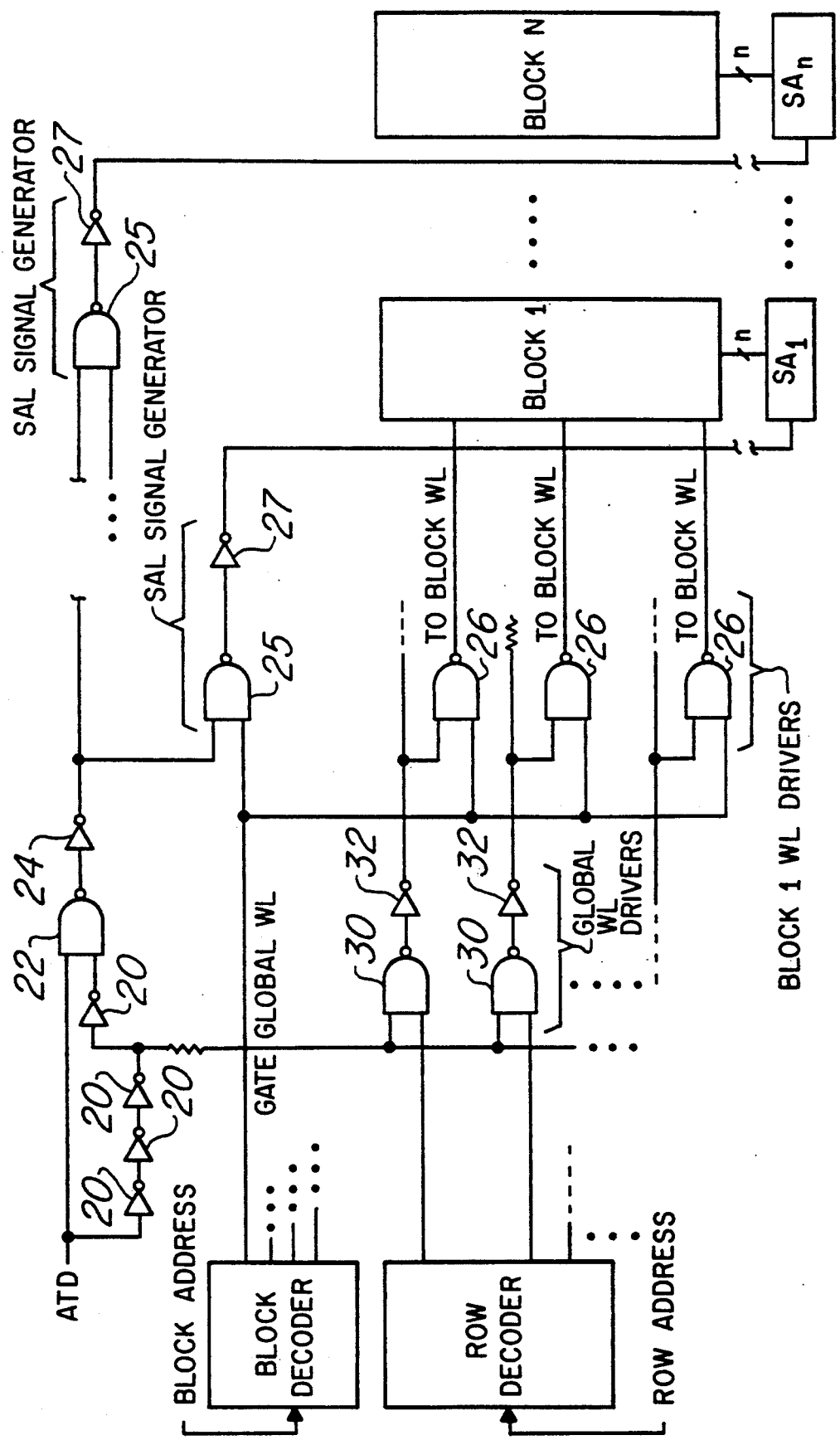
FIG. 2a is a schematic drawing which illustrates a preferred embodiment of the invention.

FIG. 2a is a schematic drawing which illustrates a preferred embodiment of the invention in which address transition detection circuitry ATD produces a negative going pulse upon a change in the row address. ATD circuitry is connected to the input of a chain of inverters 20 and to the input of NAND gate 22. The output of gate 22 is connected to the input of inverter 24. The output of inverter 24 is an input of NAND gate 25. The inverters and NAND gate modify the timing of the control of the word lines relative to the timing of the control of the precharge/equalization and the sense amp latch. Sense amp circuitry for sending a signal SAL for latching a sense amp, comprising NAND gate 25 connected to inverter 27 is capable of latching sense amp $SA_n$ (where n takes values from 1 to the number of blocks). Block word line drivers 26 comprise NAND gates including a common first input and a second input from a respective global word line. (Global referring to architectures where a hierarchy exists where general circuitry controls segmented or blocked circuitry). Global word line (WL) drivers comprise NAND gate 30 connected to the input of inverter 32. The output of inverter 32 is connected to the second input of block word line driver 26. The block decoder for selecting a block in the memory is connected to an input of NAND gate 25. A block address operates the block decoder and a row address operates a row decoder. The row decoder is connected to an input of NAND gate 30. The output of the chain of inverters 20 form the other input to NAND gate 30 of the gate global word line (WL) driver. The ATD circuitry controls timing of the word line, precharge/equalization and sense amp.

Figure 2B:
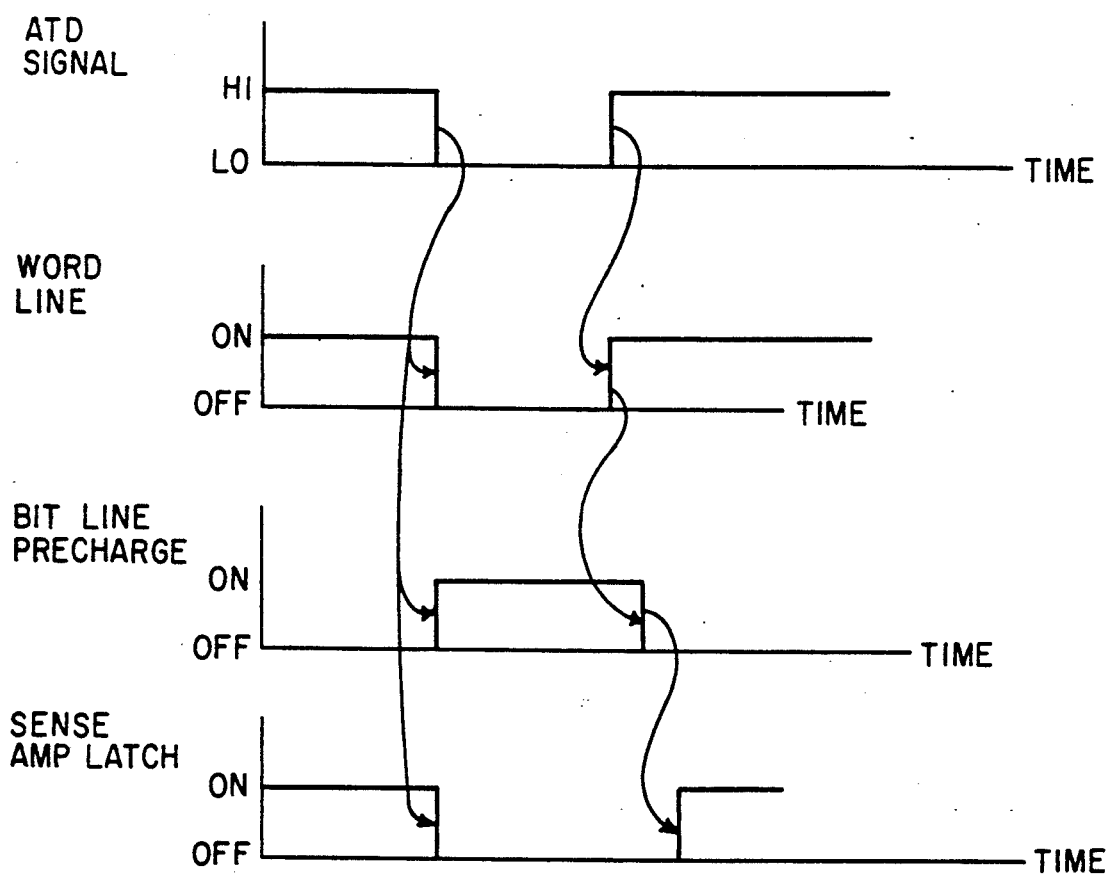

An explanation of the operation of the circuit of FIG. 2a follows with reference to the logic timing diagrams of FIG. 2b which show ATD, word line, bit line precharge/equalization and sense amp latch signals vs. time. The arrows in FIG. 2b point out the transitional relationships of the timing diagrams. The ATD pulse controls the timing of the word line, precharge, and sense amp latch. During a low ATD signal level the word line is disabled, avoiding jitter and/or overlap of word lines. While the word line is disabled, the bit lines are precharged, thereby minimizing power. Also during the low ATD signal level the sense amp is not latched. At the end of the ATD, the word line is enabled, the precharge is turned off, and the sense amp is latched. Inverter and NAND gates are used to control the relative position of the leading and falling edges of the signals that control the word line, precharge/equalization and sense amp latch such that there is an adequate signal on the bit lines at the time of latching the sense amp (bit lines take some time to reach an adequate differential voltage which a sense amplifier can correctly latch). A word line is enabled by being energized by its respective word line driver. The particular block selected depends on the block decoder. The row decoder, through the row address, selects a row in conjunction with the gate global word line. As shown, the invention controls the timing of the word line and uses a similar timing scheme to control the sense amp relative to the word line. This is an improvement over the prior art, for instance, Schuster which detects when a word line goes high and uses that to control the timing of the sense amp. Also, unlike Schuster, the present invention as shown in FIG. 2a does not have gates with a wide fan-in, therefore allowing good immunity to gamma dot and parameter variation. The invention accomplishes the non-wide fan-in feature in part by including a separate sense amplifier for each block of the memory. Although, while desirable, a one-to-one correspondence between memory columns and sense amplifiers is not necessary.

Figure 2C:
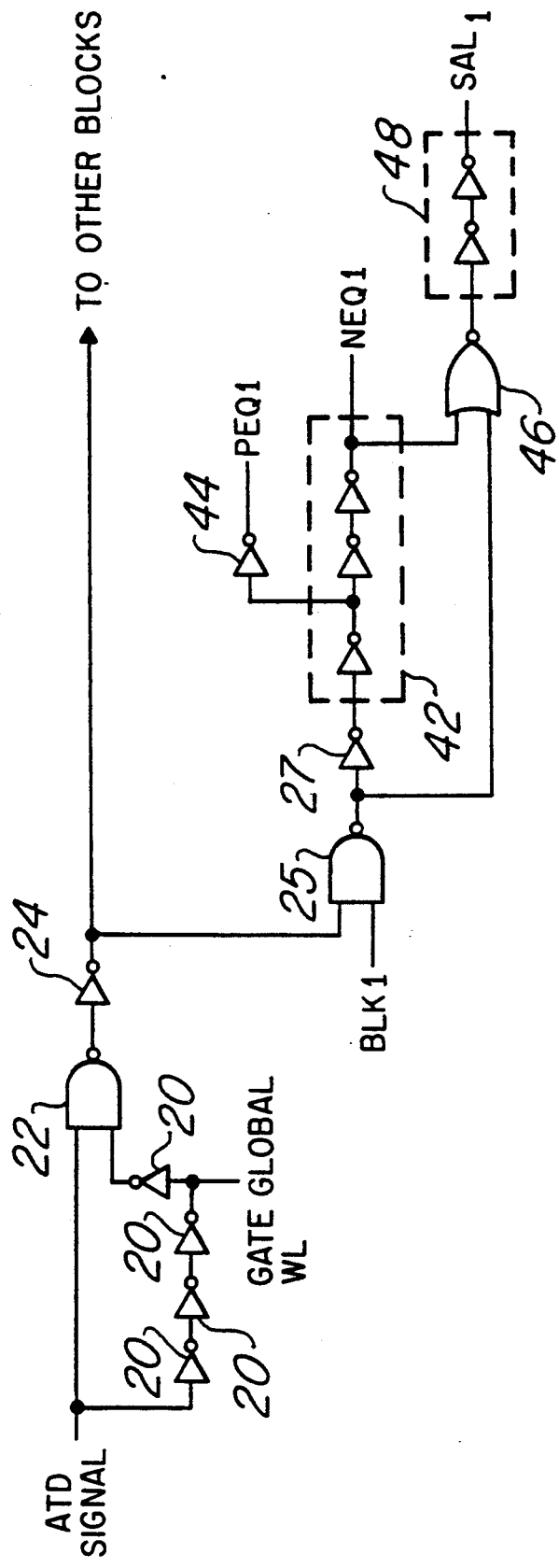
FIGS. 2c and 2d illustrate in greater detail, a schematic drawing of circuitry used to achieve the timing relationships illustrated in FIG. 2b.

More specific circuitry for implementing the timing relationships shown in FIG. 2b is shown in the schematic drawing of FIG. 2c. FIG. 2c is similar to FIG. 2a except that it shows circuitry related to one representative block, block 1 in greater detail. Inverter chain 42 is connected to the output of inverter 27 and its output NEQ1 operates the precharge/equalization circuitry associated with n-channel transistors in block 1. Inverter 44 is connected to a selected point in inverter chain 42 and its output PEQ1 operates the precharge/equalization circuitry associated with p-channel transistors in block 1. The output of NAND gate 25 and the output of inverter chain 42 are each input to NOR gate 46 whose output forms sense amp latch signal SAL₁ for a first sense amplifier after travelling through inverter chain 48. The connection of the output of NAND gate 25 to NOR gate 46 allows a fast unlatch of the sense amplifier to allow equalization and precharge. Extra delay via capacitors and/or inverters and etc. can be placed between the NEQ1 connection to an input of NOR gate 46.

Figure 2D:
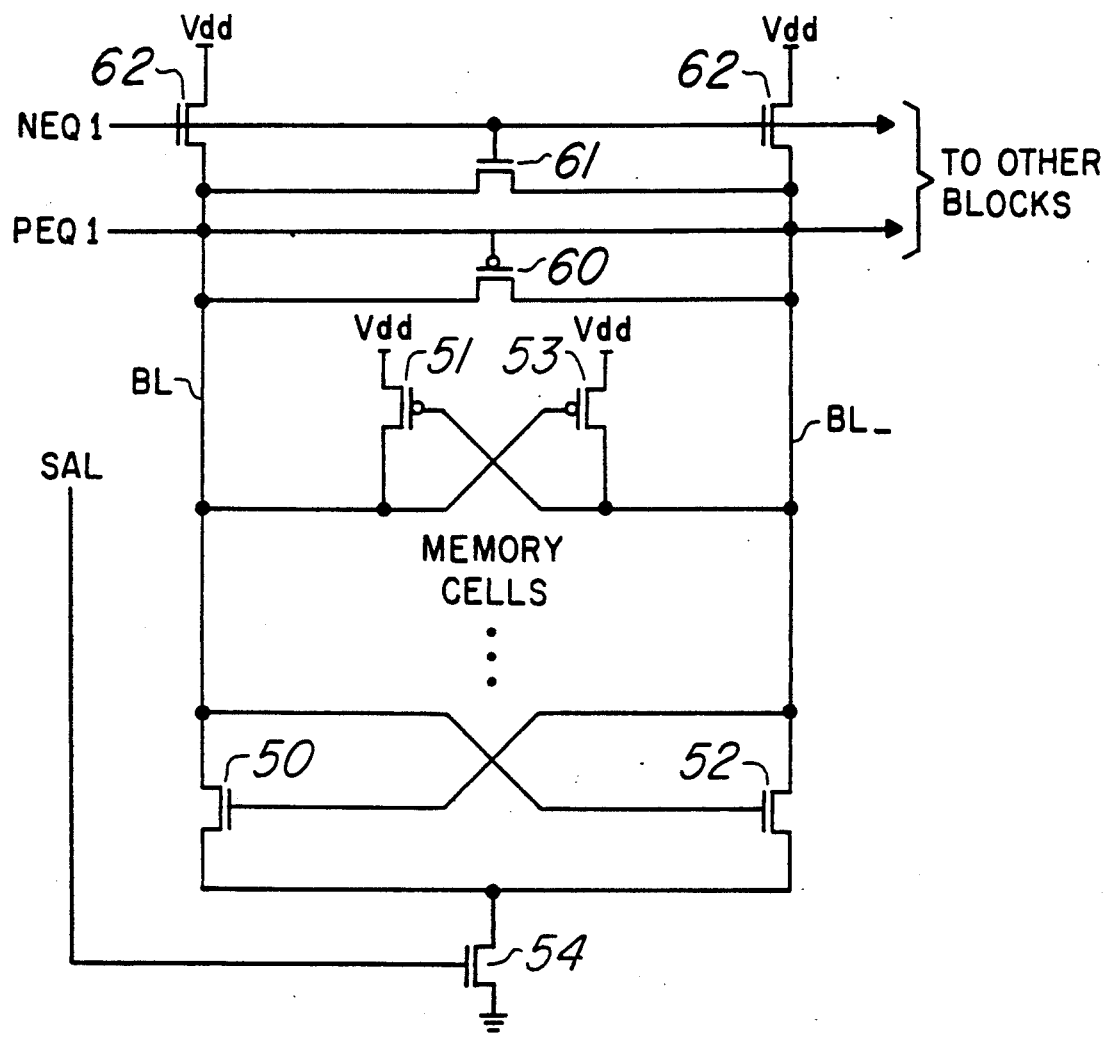

FIG. 2d is a schematic drawing of circuitry which illustrates in greater detail, the processing of the equalization signals for the bit line precharge/equalization circuitry and the sense amp latch signal SAL. The sense amplifier comprises p-channel transistors 51 and 53 cross-coupled with n-channel transistors 50 and 52. N-channel transistor 54 receives signal SAL at its gate and is operable to latch the values of a selected memory cell from a plurality of memory cells located between transistors 51,53 and transistors 50 and 52. Signal NEQ1 can cause precharge bit lines BL and BL__ through the gates of transistors 62. Precharge through n-channel transistors 62 brings bit lines BL and BL__ to a threshold voltage below the power supply voltage Vdd (rail voltage). Simultaneous precharge through p-channel transistor 60 gives a precharge all the way to the rail voltage. Transistors 60 and 61 provide equalization of bit lines BL and BL__.

Figure 3:
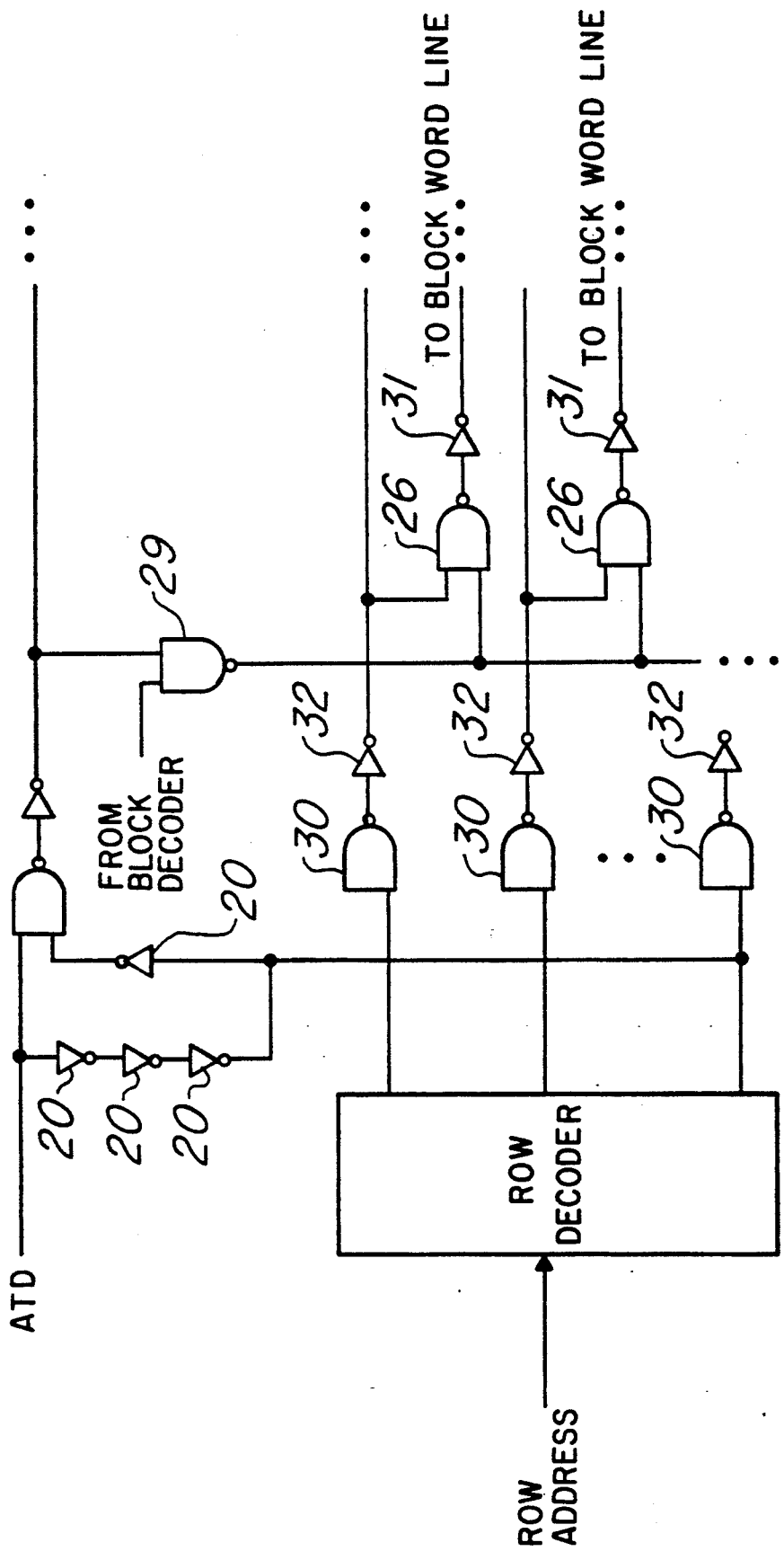
FIG. 3 illustrates an alternative embodiment of the invention.

The architecture in FIG. 2a has the global word line gated by a pulse generated through the ATD. Another architecture that could also be used is that which has the block word line gated by the ATD as shown in FIG. 3.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will now be apparent to, and may be made by a person of ordinary skill in the art having reference to this description. It is contemplated that all such changes and additional embodiments are within the spirit and true scope of the invention as claimed below. Accordingly, the invention is intended to be limited only by the scope of the appended claims.

I claim:

1. A static random access memory timing system for a static random access memory comprising:
   at least one row and one column of memory cells,
   a plurality of bit lines,
   at least one word line,
   circuitry for controlling a bit line precharge and equalization signal, and row address detection circuitry connected by a plurality of logic gates to at least one latching sense amplifier, to said circuitry for controlling said bit line precharge and equalization signal and to said at least one word line;
   said at least one latching sense amplifier associated with a pair of said plurality of bit lines, wherein the memory is operable such that said bit line precharge and equalization signal is turned on when an address transition is detected by said row address detection circuitry and simultaneously an adequate differential voltage which said sense amplifier can latch is driven on said associated pair of bit lines and such that said at least one latching sense amplifier is timed to latch after said bit line precharge and equalization signal is turned off, wherein said bit line precharge and equalization signal is turned off after the establishment of said adequate differential voltage on said associated pair of bit lines, and wherein a signal controlling the latching of said latching sense amplifier originates from said bit line precharge and equalization signal, said bit line precharge and equalization signal originating from a chain of logic processing on a row address transition detection circuit signal.

2. A static random access memory system as recited in claim 1 wherein each of said latching sense amplifiers is coupled to an associated column of memory cells.

3. An electrical circuit comprising:
an address transition detector;
a first chain of inverters, the input of said first inverter chain being connected to the output of said address transition detector;
a first NAND gate including a first and second input, said first NAND gate first input being connected to said address transition detector output and said first NAND gate second input being connected to the output of said first inverter chain;
a second NAND gate including a first and second input, said second NAND gate first input being connected to an inverted output of said first NAND gate;
a second chain of inverters, the input of which is connected to the output of said second NAND gate;
a NOR gate connected to the output of said second inverter chain; and
a third chain of inverters connected to the output of said NOR gate.

4. A static random access memory sense amplifier latch timing circuit comprising:
a latching sense amplifier;
a plurality of bit lines connected to said latching sense amplifier; and
precharge and equalization circuitry connected to said bit lines wherein said precharge signal is turned on when an address transition is detected by a row address detection circuit and, during a time when said precharge signal is turned on, a differential voltage which said latching sense amplifier can latch is driven on selected pairs of bit lines and wherein, said latching sense amplifier is operable to latch itself after the establishment of said differential voltage on said selected pairs of bit lines.

5. A static random access memory sense amplifier latch timing scheme circuit as recited in claim 4 wherein said precharge and equalization circuitry comprises a voltage pull-up device connected to said selected pairs of bit lines and a first and second transistor each connected by source/drain regions between and to said selected bit line pairs.

6. A static random access memory sense amplifier latch timing scheme as recited in claim 5 wherein said first transistor comprises a n-channel transistor and said second transistor comprise a p-channel transistor.

* * * * *